United States Patent [19]

Newyear et al.

[11] 4,021,242

[45] May 3, 1977

[54] NEGATIVE WORKING PHOTORESIST MATERIAL COMPRISING A N-VINYL MONOMER, AN ORGANIC HALOGEN COMPOUND PHOTOACTIVATOR AND A MALEIC ANHYDRIDE MODIFIED ROSIN AND THE USE THEREOF

[75] Inventors: Raymond W. Newyear, Willoughby; James M. Lewis, Aurora, both of Ohio

[73] Assignee: Horizons Incorporated, Cleveland, Ohio

[22] Filed: Aug. 15, 1975

[21] Appl. No.: 605,009

[52] U.S. Cl. .................................. 96/36; 96/67; 96/87 R; 96/115 P; 96/90 R
[51] Int. Cl.[2] ...................... G03C 5/00; G03C 1/68
[58] Field of Search ............. 96/90 R, 115 P, 35.1, 96/36, 67, 87 R; 260/101

[56] References Cited

UNITED STATES PATENTS

| | | | |
|---|---|---|---|
| 2,791,578 | 5/1957 | Drechsel et al. | 260/101 |
| 3,374,094 | 3/1968 | Wainer et al. | 96/90 R |
| 3,525,616 | 8/1970 | Hackmann et al. | 96/90 R |
| 3,563,749 | 2/1971 | Munder et al. | 96/90 R |
| 3,769,023 | 10/1973 | Lewis et al. | 96/115 P |
| 3,820,993 | 6/1974 | Lewis et al. | 96/115 P |
| 3,883,351 | 5/1975 | Lewis | 96/90 R |

*Primary Examiner*—Won H. Louie, Jr.
*Attorney, Agent, or Firm*—Lawrence I. Field

[57] ABSTRACT

A composition suitable as a negative working photoresist composition comprising an N-vinyl compound such as N-vinyl carbazole, an organic halogen compound which is a source of free radicals, and as a binder, a maleic acid anhydride modified rosin. The resist composition is deposited on a suitable support and is exposed to a pattern of radiation in the usual way. A negative image is obtained by development with an alkaline liquid.

18 Claims, No Drawings

NEGATIVE WORKING PHOTORESIST MATERIAL COMPRISING A N-VINYL MONOMER, AN ORGANIC HALOGEN COMPOUND PHOTOACTIVATOR AND A MALEIC ANHYDRIDE MODIFIED ROSIN AND THE USE THEREOF

This invention relates to a photosensitive composition which is particularly useful as a photoresist. More specifically this invention relates to a light sensitive negative-working photoresist comprised of an acidic rosin binder, an N-vinyl amine compound, and an organic halogen compound dissolved in a suitable solvent and light sensitive elements coated with such compositions an encountered in the fabrication of printed circuts, integrated circuts, printing plates, dies and the like normally employed in other lithographic arts.

U.S. Pat. No. 3,042,517 issued July 3, 1962 described a dry working composition based on a combination of vinyl monomers taken from the class of N-vinyl compounds, organic halogen compounds, and aryl amines dissolved in an organic binder which, when exposed to light, and suitably dry processed will produce a color. U.S. Pat. No. 3,042,519 issued July 3, 1962 and U.S. Pat. No. 3,046,125 issued July 24, 1962 describe a similar organic soluble composition which may be utilized as photoresists which produce a color on processing and which is made available for photoresist purposes by treatment with an organic solvent.

Compositions involving ethylenically unsaturated monomers taken from the N-vinyl compound class and organic halogen compounds which produce free-radicals on exposure to light and electron beams are described as both light sensitive and electron beam sensitive materials in U.S. Pat. Nos. 3,147,117 issued Sept. 1, 1964; 3,769,023 issued Oct. 30, 1973 and 3,820,993 issued June 28, 1974.

Compositions useful for photoresist purposes and comprising various mixtures of ethylenically unsaturated monomers, cross-linking agents and the like and useful for the manufacture of lithographic plates and printed circuits and including the use of crosslinking agents are described in U.S. Pat. No. 3,330,659 issued July 11, 1967. Compositions describing a combination of N-vinyl compounds, free-radical initiators, and various binding agents are described in U.S. Pat. No. 3,374,094 issued Mar. 19, 1968. This reference is significant for the purpose of this application in that in order to produce the hydrophilic-hydrophobic requirements for yielding a planographic-lithographic type printing plate, water emulsions of specific ingredients may be eliminated as defined in column 6 of the referenced patent.

U.S. Pat. No. 3,443,945 issued May 13, 1969 further describes the capability for a combination of N-vinyl compounds and certain organic amines to produce color on exposure to light and suitable processing, this description being classified as an extension of U.S. Pat. No. 3,042,517. U.S. Pat. No. 3,486,898 issued Dec. 30, 1969 further describes the color forming characteristics of combination of N-vinyl compounds and aryl and/or heterocyclic amines in the presence of the free-radical initiator.

U.S. Pat. No. 3,525,616 issued Aug. 25, 1970 describes a combination of an N-vinyl carbazole, (a member of the class of N-vinyl compounds), a light sensitive halogen hydrocarbon source of free-radical, and a leuco triaryl methane dye. This compositon is normally developed for resist purposes by washing in an organic solvent.

U.S. Pat. No. 3,563,749 issued Feb. 16, 1971 describes a combination of N-vinyl compounds, dyes of the merocyanine class and a halogenated hydrocarbon with a suitable polymeric binder which is dissolved in an organic solvent. After exposure to light and suitable processing, the plate is then developed by wiping with cold water. The principal application defined in this patent is for printing purposes involving such bases as paper, aluminum, copper, zinc, magnesium, and certain plastic foils. The only solvents specifically described in U.S. Pat. No. 3,563,749 for depositing (or coating) the photoresist are petroleum ether and acetone.

The disclosures of each of the prior art patents noted above are intended to be incorporated herein by reference.

It is seen that a relatively huge volume of patent literature exists dealing with the color and/or resist reactions which develop when combinations of certain complex organic amines and halogenated hydrocarbons in a sutable binder are exposed to light and thereafter processed.

The ideal photoresist composition for use in a variety of fields, such as lithography, letterpress printing, manufacture of printed circuits, preparation of microelectronic circuits, chemical milling and other photomechanical applications must exhibit an extremely wide range of chemical, physical and mechanical properties in order to make the ideal composition useful to its fullest extend in all of these applications. None of the above noted references define materials which produce a light and/or electron beam result when exposed to this type of radiation exhibit this combination of ideal properties. Nor does any normal combination of this vast art exhibit this combination of ideal properties.

The most desirable properties for an all purpose photoresist and the state of the prior art are both described in U.S. Pat. No. 3,883,351 issued to James M. Lewis, May 13, 1975, the disclosure of which is intended to be incorporated herein by this reference.

The present invention utilizes compositions similar in some respects to those of the prior art except for the presence therein of a specific kind of binder which when present in properly formulated compositions is capable of yielding a negative working photoresist.

The compositions of the present invention comprise a photopolymerizable N-vinyl monomer, usually an N-vinyl amine, amide or imide of the types described in the above noted U.S. Pat. No. 3,883,351, N-vinyl carbazole being a particularly preferred member of this class for the present invention.

The second essential constituent is an organic halogen compound in which preferably at least three halogen atoms are attached to a single carbon atom, the halogens being chlorine, bromine or iodine, or stated another way, the organic halogen compound may be represented by the formula $Q-C-X_3$ wherein Q is selected from the group consisting of H, Cl, Br, I, alkyl, substituted alkyl, aryl, substituted aryl, aroyl, and aralkyl; each X is a halogen selected from the group consisting of Cl, Br and I; and not all of the halogen atoms are required to be the same. Preferred members of this class are iodoform and carbon tetrabromide, because of their availability and cost, but it will be readily understood that other materials such as $\alpha\alpha\alpha$-tribromo-acetophenone may also be used as the organic halogen compound in the photosensitive composition and that mixtures of such compounds may be utilized instead of a single such compound, without departing from the intended scope of this invention.

Both of the above constituents are dissolved or dispersed in a suitable binder, the binder in the present invention differing from those heretofore utilized in otherwise similar compositions and possessing advantages not found in the prior art binders.

In general, the binders utilized in the prior art photoresists prepared from compositions comprising organic halogen compounds and N-vinyl compounds exhibited a solubility in organic solvents. The binders utilized in the compositions of the present invention are soluble in alkalies. These binders are commercially available rosin materials, modified by reaction with maleic anhydrides as described in "Encyclopedia of Polymer Science and Technology," Volume 12, page 145, edited by N. M. Bikales, Interscience Publishers, John Wiley and Son Incorporated, 1970. Such rosins are well known and are typified by those examples that appear in U.S. Pat. Nos. 2,121,294 issued June 21, 1938; 2,197,046 issued Apr. 16, 1940; and 2,791,578 issued May 7, 1957. Specifically, those maleic anhydride modified rosins found to be most effective in this invention are those having an acid number between 80 and 135 and having a high degree of alcohol solubility.

The proportions of the three essential components may be varied within broad ranges without impairing the usefulness of the composition as a photoresist.

A fourth constituent of the resist composition can be a stabilizer, preferably a phenol represented by the general formula

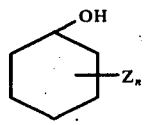

wherein Z represents one or more hydroxyl, amino, alkyl and allyl groups and $n$ is an integer not less than 1 and not greater than 5. When $n$ is greater than 1, all of the Z's used need not be the same. Examples are p-aminophenol, catechol, 2-4-ditertpentylphenol, 2,5-bis(1-1-dimethylpropyl) hydroquinone, 2,6-ditertbutyl-p-phenol, tertbutylhydroxyanisole, etc.

Other organic amines or weakly alkaline inorganic compounds may be used in place of, or in addition to, the phenolic compounds noted above.

In addition to the constitutents described above, the photosensitive compositions of this invention may also include any of a variety of additives which are usually employed to impart specific benefits to the composition, e.g. sensitizers to enhance the sensitivity of the composition to actinic radiation of specific wavelengths, dyes or pigments to enhance the visual contrast of the developer image, adhesion promoting agents and other additives if additional properties are to be modified.

Thus the formulation may consist of the following in parts by weight

| | |
|---|---|
| organic halogen compound | 10 to 150 |
| N-vinyl compound | 25 to 150 |
| maleic anhydride modified rosin | 100 to 2000 |

-continued

| | |
|---|---|
| stabilizer | 1 to 100. |

When N-vinyl carbazole and iodoform are utilized, a more preferred composition would involve an NVC to iodoform ratio of between 2 to 1 and 3 to 1 and a maleic anhydride rosin content of between 2.5 to 3 times the combined weight of NVC and iodoform.

The thickness of the light sensitive layer is not critical, and may depend in part on the substrate to which it is applied. A preferred substrate is copper foil but anodized aluminum, glass, paper, synthetic resins such as polyethylene terephthalate and other materials have been found to be suitable.

The examples which follow are intended to illustrate preferred embodiments of the invention and are not intended to limit the same.

EXAMPLE I

Compositions of this invention should be prepared from pure starting materials. Commercially available materials may be further purified if necessary. For many compositions, preparation under yellow bug lights or Wratten OA safelight filters are satisfactory. For others it is necessary to prepare under red safelights or in total darkness when the composition is sufficiently sensitive.

To 640 grams of n-propanol was added 160 grams of maleic anhydride modified rosin Unirez-7057 (Union Camp Co.), 48 grams of N-vinyl carbazole, 32 grams of iodoform and 3.2 grams of 2,6-di-t-butyl cresol. The mixture was stirred until a homogeneous solution was obtained and then diluted 1:1, vol:vol with n-propanol. Hand coatings on 1 oz. copper were prepared using a 1½ mil doctor bar applicator and dried for 2½ minutes at 31° C in a forced draft oven. The sensitized copper substrate was then given a 12½ second image-wise exposure using a pulsed Xenon arc source having a heat absorbing filter and delivering an intensity at the exposure plane of two microwatts per square centimeter. This was followed by heating the exposed coating for 1 minute at 100° C in a forced draft oven. Development was carried out by immersion for 15 seconds in an aqueous solution of sodium carbonate (4% by weight) and triethyl phosphate (0.5% by weight). A negative rendition of the original artwork was obtained which exhibited excellent resistance to etchants such as sulfuric-chromic acid mixtures, ferric chloride, and ammonium persulfate, and electroplating baths such as tin, tin-lead, nickel and copper (acid copper and copper fluoborate).

EXAMPLE II

To 11 parts of the diluted formulation described in Example I was added 1 part of a 3% (weight:weight) solution of polyvinyl butyral, Butvar B72A (Monsanto Co.), in n-propanol. The coating and processing of this formulation was carried out as described in Example I. This resist exhibits remarkable resistance to prolonged acidic etching and gold plating conditions.

EXAMPLE III

To 30 ml of a 20% weight:weight solution of maleic anhydride modified rosin Arochem 475 (Ashland Chemical Co.) in n-propanol was added 30 ml of n-propanol, 1.5 grams of N-vinyl carbazole, and 1 gram of iodoform. Coating and processing of this composition paralleled that described in Example I and the results were similar.

EXAMPLE IV

To 480 grams of n-propanol was added 120 grams of maleic anhydride modified rosin Unirez A-750 (Union Camp Corporation), 24 grams of iodoform, 36 grams of N-vinyl carbazole, 2.4 grams of 2,6-di-t-butyl cresol, and 5 ml of Automate Red dye solution (Morton Chemical Company). The resulting solution was coated and processed as described in Example I, yielding a high contrast red resist image possessing excellent etch and plating resistance.

EXAMPLE V

To the formulaton described in Example IV was added 80 mg of 3 ethyl-5[3 ethyl-3(3H)-benzoxazolyidene)-ethylidene]-rhodanine. Coating and processing were carried out as described above with the exception that exposures were carried out using a 650-watt quartz-iodine light source equipped with a 4,880 Angstrom narrow band pass filter and having an intensity at the exposure plane of 1/6 microwatt per square centimeter. A 60-second exposure was found to be more than sufficient in generating an acceptable resist image.

In addition to rhodanine dyes, other classes of dyes that have been used include cyanines and merocyanines, as well as rubrene types.

Examples of types of pigments or dyes which have been used to enhance the contrast include solvent anthraquinone and dis-azo types such as Automate Red B, Automate Blue 8 and Automate Yellow 8 (Morton Chemical Co.).

Numerous alkaline developers were found to be compatible with any and all of the Examples described above including aqueous solutions of sodium hydroxide, triethylamine, sodium phosphate, ammonium hydroxide, and piperdine ranging in concentration from 1 to 12% (range of pH 8–14; preferred range 9.5–11.5).

Resists according to the present invention are formulated from the following:

|  | Parts by Weight | |
|---|---|---|
|  | Broad | Preferred |
| Organic halogen compound | 10 – 150 | 25 – 75 |
| N-vinyl compound | 25 – 150 | 50 – 100 |
| Maleic anhydride modified rosin | 100 – 2000 | 200 – 500 |
| Substituted phenol (Optional) | 1 – 100 | 1 – 10 |
| Sensitizing dye (Optional) | 0.1 – 10 | 1 – 5 |
| Pigment or dye for contrast (Optional) | 1 – 50 | 2.5 – 10 |

We claim:

1. In a photoresist which consists of a photosensitive composition and a support for said composition, wherein the photosensitive composition consists essentially of (1) an N-vinyl monomer selected from the group consisting of N-vinylamines, N-vinylamides, and N-vinylimides, and (2) an organic halogen compound which splits off free radicals which assist in the polymerization of said monomer when said composition is exposed to a suitable dose of actinic radiation, the improvement which consists in providing as a binder for said N-vinyl monomer and said organic halogen compound, a maleic anhydride modified rosin having an acid number between 80 and 135 and which is soluble in alcohol.

2. The photoresist of claim 1 wherein the N-vinyl monomer is N-vinylcarbazole, and the organic halogen compound is represented by the formula $QCX_3$ wherein Q is selected from the group consisting of H, Cl, Br, I, alkyl, substituted alkyl, aryl, substituted aryl, aroyl and aralkyl, and each X is selected from the group consisting of Cl, Br and I and all of the X's are not required to be the same.

3. The composition of claim 2 wherein the organic halogen compund is $CHI_3$.

4. The composition of claim 2 wherein the organic halogen compound is $CBr_4$.

5. The composition of claim 2 wherein the organic halogen compound is $C_2Br_6$.

6. The composition of claim 1 including in addition at least one sensitizing dye which extends the spectral response of the composition.

7. The composition of claim 6 wherein the sensitizing dye is a rhodanine dye.

8. The composition of claim 1 including in addition at least one pigment or dye in an amount sufficient to enhance visual contrast when the resist is developed.

9. The photoresist of claim 1 wherein the composition comprises the following proportions in parts by weight:
   organic halogen compound: 10 to 150;
   N-vinyl compound: 25 to 150;
   maleic anhydride modified rosin: 100 to 2000.

10. The photoresist of claim 9 wherin the organic halogen compound is iodoform, the N-vinyl compund is N-vinyl carbazole, and the proportions are between 1:2 and 1:3 by weight and the maleic anhydride modified rosin binder is present between 2.5 and 3 times the combined weight of the iodoform and N-vinyl carbazole.

11. The resist of claim 1 wherein the support is a metal substrate.

12. The resist of claim 11 wherein the metal substrate is copper.

13. The resist of claim 11 wherein the metal is anodized aluminum.

14. The resist of claim 1 wherein the support is glass.

15. The process which comprises:
   preparing a solution of the photosensitive material defined in claim 1;
   coating the solution onto a solid substrate;
   drying the coating;
   imagewise exposing the coating to suitable radiation;
   heating to complete polymerization of the exposed portions of the coating; and
   developing the resulting resist with an aqueous alkaline solution.

16. The process of claim 15 wherein the developing solution has a pH between about 8 and 14.

17. The process of claim 16 wherein the pH is between about 9.5 and about 11.5.

18. The composition of claim 2 wherein the organic halogen compound is $\alpha\alpha\alpha$-tribromoacetophenone.

* * * * *